United States Patent [19]

Dent

[11] Patent Number: 5,668,837
[45] Date of Patent: Sep. 16, 1997

[54] DUAL-MODE RADIO RECEIVER FOR RECEIVING NARROWBAND AND WIDEBAND SIGNALS

[75] Inventor: Paul W. Dent, Stehag, Sweden

[73] Assignee: Ericsson Inc., Research Triangle Park, N.C.

[21] Appl. No.: 383,036

[22] Filed: Feb. 3, 1995

Related U.S. Application Data

[63] Continuation-in-part of Ser. No. 135,542, Oct. 14, 1993.

[51] Int. Cl.$^6$ ............................................. H03K 9/00
[52] U.S. Cl. ................................. 375/316; 455/307
[58] Field of Search ............................ 375/316, 260, 375/267, 299, 349, 356, 347; 455/59, 131, 137, 138, 139, 145, 146, 339, 340, 307

[56] References Cited

U.S. PATENT DOCUMENTS

| | | | |
|---|---|---|---|
| 4,045,740 | 8/1977 | Baker | 325/427 |
| 4,124,817 | 11/1978 | Takahashi | 325/344 |
| 4,262,361 | 4/1981 | Hauer | 455/113 |
| 4,267,605 | 5/1981 | Matsuzawa et al. | 455/266 |
| 4,352,208 | 9/1982 | Schroeder | 455/266 |
| 4,356,567 | 10/1982 | Eguchi et al. | 455/177 |
| 4,406,019 | 9/1983 | Ide et al. | 455/245 |
| 4,458,207 | 7/1984 | Favreau et al. | 329/136 |
| 4,479,091 | 10/1984 | Yoshisato | 329/122 |
| 4,479,257 | 10/1984 | Akiyama | 455/266 |
| 4,563,651 | 1/1986 | Ohta et al. | 329/110 |
| 4,761,829 | 8/1988 | Lynk, Jr. et al. | 455/307 |
| 4,792,993 | 12/1988 | Ma | 455/266 |
| 4,816,770 | 3/1989 | Naumann | 329/122 |
| 4,885,553 | 12/1989 | Hietala et al. | 331/17 |
| 4,984,247 | 1/1991 | Kaufmann et al. | 375/1 |
| 4,989,264 | 1/1991 | Ohto | 455/266 |
| 5,012,490 | 4/1991 | Myer | 375/58 |
| 5,048,059 | 9/1991 | Dent | 375/94 |

(List continued on next page.)

OTHER PUBLICATIONS

U.S. Patent Application, SN 08/135,542, filed Oct. 14, 1993 Paul Dent.
U.S. Patent Application, SN 08/305,780 filed Oct. 14, 1994, Paul Dent.
U.S. Patent Application, SN 08/179,953 filed Jan. 11, 1994 Paul Dent.
U.S. Patent Application, SN 08/218,236, filed Mar. 28, 1994, Paul Dent et al.
U.S. Patent Application, SN 08/305,787, filed Sep. 14, 1994, Paul Dent et al.
U.S. Patent Application, SN 08/059,932 filed May 11, 1993, Thomas M. Croft et al.

*Primary Examiner*—Stephen Chin
*Assistant Examiner*—Kevin Kim
*Attorney, Agent, or Firm*—David G. Matthews

[57] ABSTRACT

A radio receiver for a radio operable in a radio communication system utilizing either a wideband standard such as GSM or a narrowband standard such as IS-54. The radio receiver has a wideband mode for demodulating wideband signals and a narrowband mode for demodulating narrowband signals. The radio receiver uses a wideband filter apparatus having a wide filter bandwidth adapted to the wideband signals for filtering both the wideband and narrowband signals. When in the narrowband mode, a digitizer digitizes the filtered signals containing the narrowband signal and produces digital signals having amplitude and phase signals corresponding to the filtered signals. A digital signal processor is used to frequency shift the digital signals so as to shift the narrowband signals to the center frequency of the wideband filter apparatus. The frequency-shifted narrowband signals are then filtered to select the centered narrowband signals and the narrowband signals are then demodulated. The digital signal processor is adapted to frequency-shift a plurality of different narrowband signals at different radio channel frequencies and to demodulated the different narrowband signals to provide for diversity combination.

37 Claims, 3 Drawing Sheets

U.S. PATENT DOCUMENTS

| | | | |
|---|---|---|---|
| 5,058,204 | 10/1991 | Tahernia et al. | 455/183 |
| 5,068,625 | 11/1991 | Baker et al. | 331/1 A |
| 5,084,669 | 1/1992 | Dent | 324/83 |
| 5,095,534 | 3/1992 | Hiyama | 455/266 |
| 5,097,221 | 3/1992 | Miller | 329/318 |
| 5,105,164 | 4/1992 | Fisher et al. | 330/149 |
| 5,109,528 | 4/1992 | Uddenfeldt | 455/33.2 |
| 5,136,645 | 8/1992 | Brockman | 380/34 |
| 5,148,373 | 9/1992 | Dent | 364/484 |
| 5,159,709 | 10/1992 | Hansen | 455/266 |
| 5,191,598 | 3/1993 | Backstrom et al. | 375/100 |
| 5,233,626 | 8/1993 | Ames | 375/349 |
| 5,241,702 | 8/1993 | Dent | 455/278.1 |
| 5,287,556 | 2/1994 | Cahill | 455/266 |
| 5,303,413 | 4/1994 | Braegas | 455/266 |
| 5,323,391 | 6/1994 | Harrison | 375/349 X |

DUAL-MODE RADIO RECEIVER FOR RECEIVING NARROWBAND AND WIDEBAND SIGNALS

CROSS-REFERENCE TO RELATED APPLICATIONS

This application is a continuation-in-part of U.S. patent application Ser. No. 08/135,542, filed by Paul Dent on Oct. 14, 1993, and entitled "Adaptive Bandwidth Receiver" ("parent application"). The parent application is assigned to the assignee of the present invention and is incorporated herein by reference.

FIELD OF THE INVENTION

The invention generally relates to radio receivers for operating in radio communication systems and more specifically to dual-mode radio receivers for receiving narrowband and wideband signals.

BACKGROUND OF THE INVENTION

Cellular communication systems can be based on a variety of different cellular standards employing Frequency Division Multiple Access (FDMA), Time Division Multiple Access (TDMA), and combinations of FDMA and TDMA. These cellular communication systems use frequency modulation to transmit speech and data information on a variety of different radio channel frequencies. The channel spacing between the different radio channel frequencies used in a cellular communication system varies depending on the cellular standard employed. Wideband cellular standards such as IS-95 and GSM require wide channel spacing to receive wideband frequency- modulated signals ("wideband signals"), while narrowband cellular standards such as NAMPS and the IS-54 standard require a narrower channel spacing to receive narrowband frequency-modulated signals ("narrowband signals").

Prior art cellular radios having dual-mode receivers have been designed to operate in cellular communication systems employing either a narrowband standard or a wideband standard, for example, IS-95 dual-mode phones, or the dual-mode satellite/cellular phone described in U.S. patent application Ser. No. 08/305,780, filed Sep. 14, 1994, and entitled "Dual-Mode Frequency Synthesizer for Satellite/ Cellular Phones," which is incorporated herein by reference. These prior art dual-mode receivers are capable of demodulating both wideband signals and narrowband signals. In order to demodulate both wideband signals and narrowband signals, the dual-mode receivers of the prior art use duplicate receiver components. For example, prior art dual-mode receivers use a wideband filter apparatus to filter the received wideband signals and a different narrowband filter apparatus to filter the narrowband signals. The duplication of receiver components in a dual-mode receiver increases the size and cost of the cellular radio. A dual-mode receiver is needed that reduces the duplication required to demodulate both wideband and narrowband signals.

SUMMARY OF THE INVENTION

The present invention provides an improved dual-mode radio receiver operating in a radio communication system that uses either wideband or narrowband signals. The radio receiver demodulates wideband and narrowband signals with reduced duplication of receiver components. The radio receiver has a wideband mode (e.g., the GSM or IS-95 standard) for demodulating wideband signals and a narrowband mode (e.g., the IS-54 or INMARSAT-M satellite communications standard) for demodulating narrowband signals. A wideband filter apparatus adapted for a wideband mode and having a wide filter bandwidth is provided for filtering radio signals containing alternatively wideband signals and narrowband signals. When in the wideband mode, the wideband filter apparatus receives radio signals and extracts wideband signals. The extracted wideband signals are demodulated by well-known methods.

When in the narrowband mode, the wide bandwidth filter apparatus receives radio signals containing narrowband signals and generates filtered signals which contain the narrowband signals in subbands of the wide filter bandwidth. The filtered signals are digitized and processed with a digital filter. The digital filter has a narrow filter bandwidth adapted to the narrowband signals and separates the desired narrowband signals by filtering out unwanted flanking signals.

The radio receiver is adapted to perform the extraction of narrowband signals existing in off-center subbands of the wide filter bandwidth. Furthermore the radio receiver can be adapted to jointly extract two or more different narrowband signals that are at different radio channel frequencies and that are located in different subbands of the wide filter bandwidth. The extraction of different narrowband signals lying in off-center subbands of the wide filter bandwidth is an important useful feature of the invention claimed herein. In the parent application, the invention was described to receive narrowband signals lying nominally in the center of the wide filter bandwidth with the undesired flanking signals flanking the desired narrowband signals.

Logpolar signal processing is the preferred digital processing method for processing the wide bandwidth filtered signal in order to allow for more efficient separation of desired narrowband signal from flanking signals. Logpolar signal processing is disclosed in U.S. Pat. No. 5,048,059, issued on Sep. 10, 1991, and entitled "Log-Polar Signal Processing," and is incorporated in the present application by reference. Logpolar signal processing is a preferred method of digitizing the wide bandwidth filtered signal which avoids the complication of Automatic Gain Control (AGC).

After extraction of different narrowband signals with the use of logpolar processing, the extracted narrowband signals are then combined to provide diversity reception for improved signal decoding. In one embodiment, the different narrowband signals are transmitted from two different orbiting satellites to create path diversity and enhance probability of receiving good signal quality.

Accordingly, it is an object of the present invention to provide a dual-mode radio receiver for demodulating narrowband and wideband signals.

Another object of the present invention is to reduce receiver component duplication required for a dual-mode radio receiver by providing a wideband filter bandwidth to filter both wideband and narrowband signals.

Another object of the present invention is to provide a radio receiver that uses logpolar processing in extracting narrowband signals existing in off-center subbands of a wide filter bandwidth.

Another object of the present invention is to provide a radio receiver that uses logpolar processing in extracting two or more different narrowband signals that are located in different subbands of a wide filter bandwidth and to then combine the extracted narrowband signals to provide diversity reception.

These and other objects of the invention, together with features and advantages therefore, will become apparent

DETAILED DESCRIPTION OF THE PREFERRED EMBODIMENTS

Figure 1:
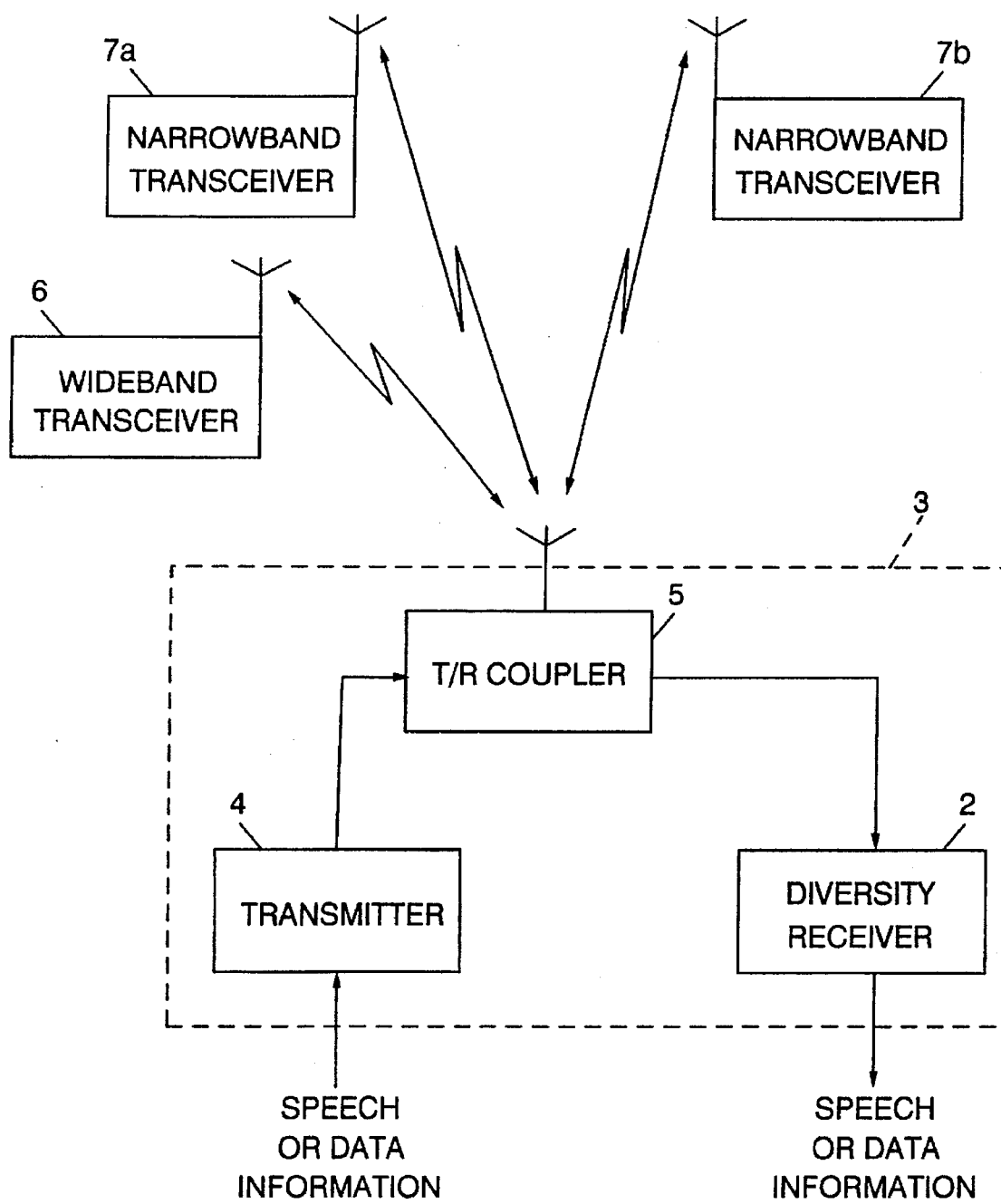
FIG. 1 is a block diagram showing the dual-mode radio receiver in accordance with the present invention employed in a radio communication system.

Referring to FIG. 1, the dual-mode radio receiver 2 of the present invention is shown implemented in a cellular radio 3 having a transmitter 4 and transmit/receive (T/R) coupler 5. The radio receiver 2 has a wideband mode and a narrowband mode designed to enable radio 3 to receive radio signals containing wideband frequency-modulated signals ("wideband signals") and narrowband frequency-modulated signals ("narrowband signals").

More specifically, radio 3 by employing radio receiver 2 is capable of receiving information from either a base station wideband transceiver 6 operating in accordance with a wideband standard or base station narrowband transceivers 7a, 7b operating in accordance with a narrowband standard. The base station wideband transceiver 6 transmits and receives wideband signals and the base station narrowband transceivers 7a, 7b transmit and receive narrowband signals. The transceivers 6, 7a, 7b can be adapted to conform to a variety of different standards that require the use of wideband or narrowband signals to transmit and receive information.

For example, the narrowband signals can be continuous transmissions in a frequency division multiple access system (FDMA) or time division multiple access transmissions (TDMA). An example of a narrowband TDMA system is the U.S. Digital cellular system conforming to the telecommunications Industry Association standard IS-54. This standard is incorporated by reference as an example of narrowband TDMA waveforms and protocols. The wideband signals can for example conform to the European digital cellular standard known as GSM. The GSM standard is publicly available under that name and is hereby incorporated by reference in its entirety as an example of wideband TDMA waveforms and protocols. Alternatively, the wideband mode may conform to the Code Division Multiple Access system described in TIA standard IS-95, which is also incorporated by reference herein.

In a preferred embodiment, the base station wideband transceiver 6 is land-based and the base station narrowband transceiver 7a, 7b are contained in different orbiting satellite relay stations and their associated ground stations, where the different satellite relay stations illuminate the same area on the earth. The transmitters 7a, 7b each transmit a narrowband signal which contains the same speech or data information on two different but nearby frequency channels. As disclosed in U.S. patent application Ser. No. 08/179,953, filed Jan. 11, 1994, and entitled "A Cellular/Satellite Communications System With Improved Frequency Re-Use," suitable satellite configurations can be used to relay signals from the satellites to an earth station connected to a public switched telephone network. The above-identified U.S. patent application Ser. No. 08/179,953 is hereby incorporated by reference in its entirety.

The radio receiver 2 is particularly designed to receive either wideband signals from the wideband transceiver 6 or narrowband signals from the narrowband transceivers 7a, 7b. As discussed in detail below, the receiver 2 has a wide filter bandwidth adapted to the wideband mode which filters received radio signals when the receiver 2 is in either the narrowband or wideband mode. In the preferred embodiment, the radio receiver 2 when operating in the narrowband mode extracts the narrowband signals from the filtered radio signals through digital processing and combines the extracted narrowband signals to provide for diversity combination.

Figure 2:
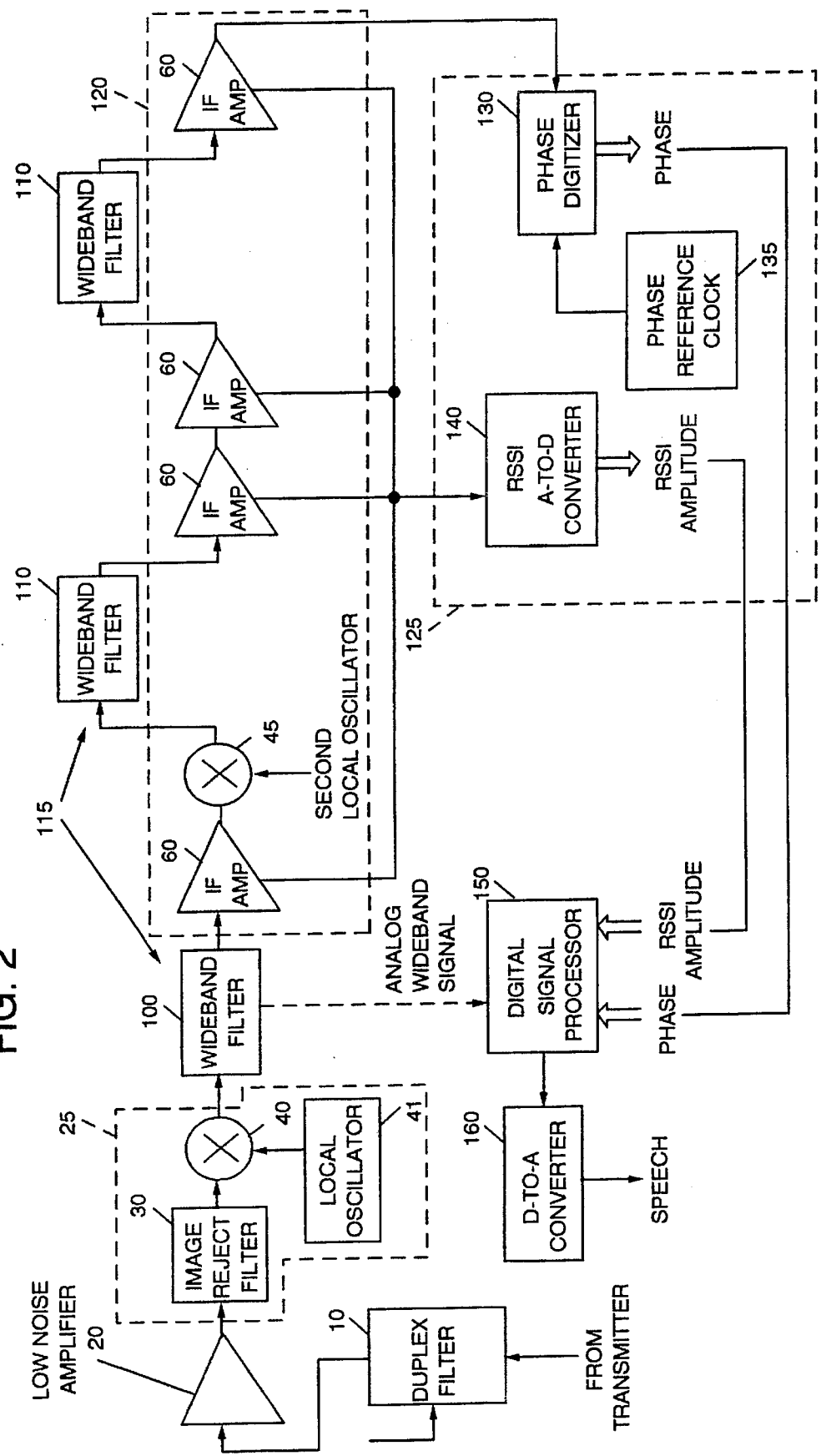
FIG. 2 is a block diagram of the dual-mode radio receiver in accordance with the present invention.

With reference to FIG. 2, the radio receiver 2 of the present invention for implementing both wideband and narrowband modes is shown in more detail. The radio receiver 2 includes a duplex filter 10 for providing the transmit/receive (T/R) coupling needed to connect the receiver 2 and the transmitter 4 to the same antenna in the event that the transmitter 4 and receiver 2 must operate at the same time (Frequency Division Duplex). A T/R coupler 5 can also be implemented with a T/R switch in the event that a Time Division Duplex system is required.

The duplex filter 10 receives radio signals that may include wideband or narrowband signals transmitted from the base station transceivers 6, 7a, 7b. The received radio signals are outputted by duplex filter 10 to low noise amplifier 20. After low-noise amplification in low noise amplifier 20, the received radio signals are outputted to a downconverter 25 which can comprise an image reject filter 30, mixer 40 and local oscillator 41. The downconverter 25 converts the received radio signals to a suitable first intermediate frequency (IF) or first downconverted signal and outputs the first downconverted signal to a wideband filter 100.

The wideband filter 100 is adapted to the wideband signals transmitted by wideband transceiver 6 and restricts the signal bandwidth of the received radio signals in accordance with the bandwidth of the wideband signals. The filtered signal is outputted to an intermediate frequency (IF) amplifier circuit 120 and additional wideband filters 110 that are adapted for the wideband signals. The wideband filters 100, 110 form a wideband filter apparatus 115 that establishes a wide signal pass bandwidth ("wide filter bandwidth") for the receiver 2. The wide filter bandwidth of the wideband filter apparatus 115 is adapted to filter the received radio signal so as to provide a filtered signal having a wide bandwidth adapted to the wideband signal.

Amplifier circuit 120 includes a logarithmic amplifier-detector chain (amplifiers 60) and a second downconverter 45. The amplifier circuit 120 produces an analog output including a Radio Signal Strength Indication (RSSI) and a hardlimited signal. The RSSI is an analog voltage approximately proportional to the logarithm of the instantaneous amplitude of the radio signals+noise. The final amplifier 60 in the amplifier circuit 120 produces the analog hardlimited signal from which a representation of instantaneous phase angle of the radio signals+noise can be extracted.

The filtered signals from the amplifier circuit 120 are processed differently by the receiver 2 depending on whether the receiver 2 is in the narrowband mode or the wideband mode. When in the wideband mode, the filtered signals are inputted into digitizer 125 as shown in FIG. 2. The digitizer 125 converts the filtered signals to digital signals with the aid of sampling and digitizing where the bandwidth and sampling rates of digitizer 125 are adapted to the wideband mode.

Figure 3:
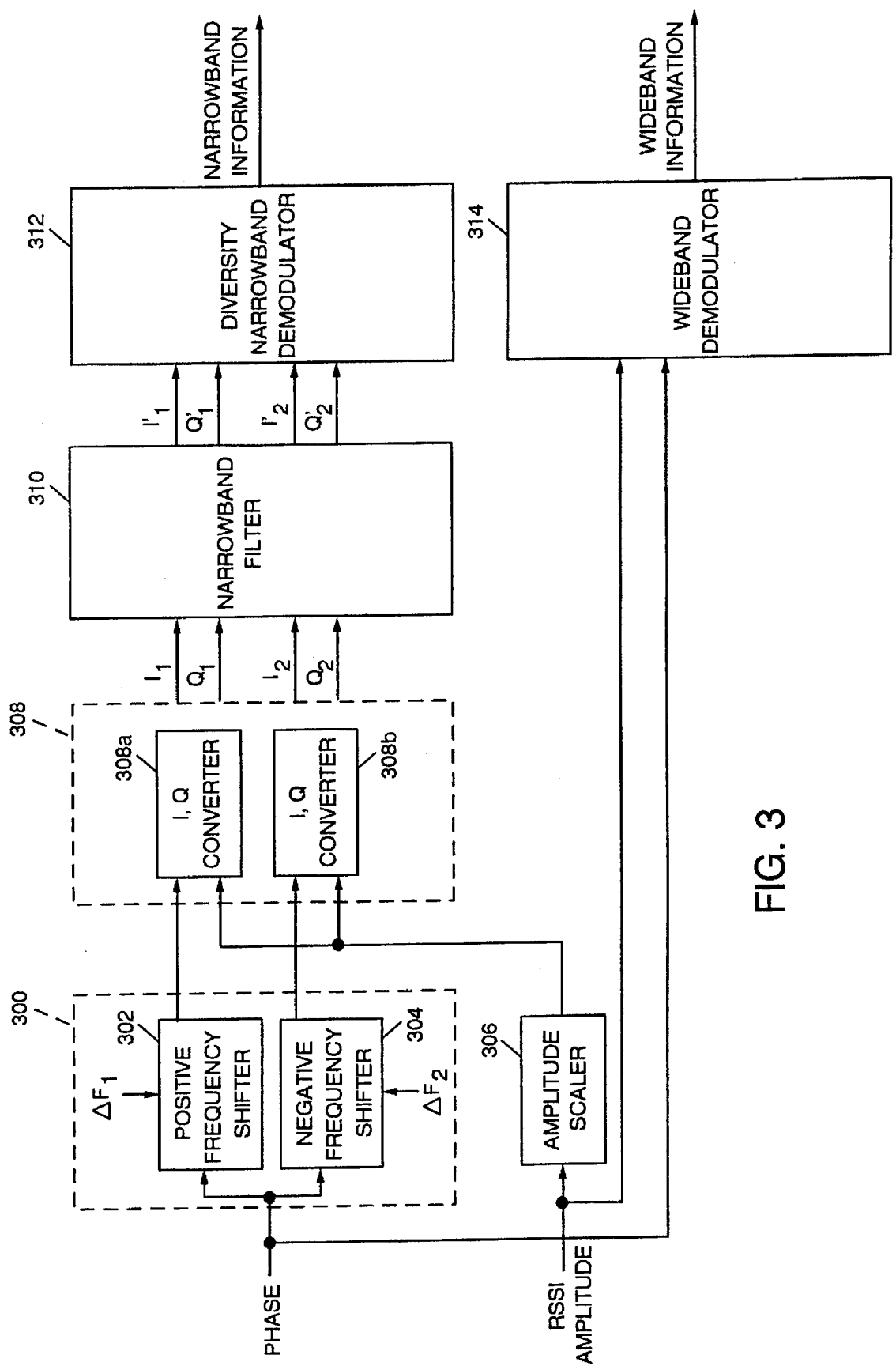
FIG. 3 is a schematic diagram depicting the processing of digital signals in accordance with the present invention.

The digital signals form a complex number stream, as shown in FIG. 3, and are inputted to a wideband demodulator 314 which decodes the digital signals to recover speech and data information conveyed by the wideband signal. In the alternative, the filtered signals can be fed directly to the wideband demodulator 314 from wideband filter 100 for demodulation, as shown by the dotted lines in FIGS. 2 and 3. Various techniques for demodulating the filtered signals when receiver 2 is in the wideband mode can be used and are well-known in the prior art.

When in the narrowband mode, the filtered signals from the amplifier circuit 120 are inputted into digitizer 125. The digitizer 125 includes a phase digitizer 130 and RSSI A-to-D converter 140. The phase digitizer 130 converts the hard-limited signals of the filtered signals to fixed-point phase words. The RSSI A-to-D converter 140 simultaneously produces RSSI amplitude words which are digital representations of the logamplitude signals of the filtered signals. The RSSI amplitude words and the phase words form logpolar digital signals which are the logpolar representations of the instantaneous radio signals+noise value inputted into the digitizer 125.

One embodiment of logpolar signal processing involves generating a fixed-point, modulo-2Pi digital representation of instantaneous phase information, which can for example be performed by a direct phase digitizing circuit such as described in U.S. Pat. No. 5,084,669, issued on Jan. 28, 1992, and entitled "Direct Phase Digitization," or U.S. Pat. No. 5,148,373, issued on Sep. 15, 1992, and entitled "Method and Arrangement for Accurate Digital Determination of the Time or Phase Position of a Signal Pulse Train", both of which are also incorporated by reference. It is also possible to extract phase representations from hardlimited Intermediate Frequency signals by other means mentioned in the above patents, namely by quadrature sampling or converting the filtered, hardlimited IF signal to obtain normalized Cartesian components (X+jY) and then computing an Arctangent to obtain a phase word.

The logpolar digital signals including the digital RSSI and phase signals, are then inputted to the digital signal processor 150 for processing. Successive logpolar digital signals are fed to digital signal processor 150 which can either be a programmable digital signal processor operating under the control of a software program stored in Read Only Memory, or can comprise dedicated hardware for performing logpolar processing.

The filtered signals are converted to logpolar digital signals by digitizer 125 so that logpolar signal processing of the radio signals can be performed. Logpolar signal processing enables the desired narrowband signals contained in the radio signals to be more efficiently extracted. Logpolar signal processing comprises adjusting signal amplitude and frequency of logpolar digital signals.

Through logpolar signal processing, the amplitudes of the digital signals can be adjusted into a convenient range by addition of scaling factors to RSSI values. The signal frequencies of logpolar digital signals can also be adjusted to remove errors by modulo addition of incrementing or decrementing phase values to the phase values of the logpolar digital signals. These operations are more conveniently performed in the logpolar domain. In particular, scaling, which normally requires the more complex multiplication operation, becomes simply fixed point addition/subtraction in the logamplitude domain. Frequency shifting, which normally requires complex multiplications in the Cartesian (X+jY or I,Q domain), requires only fixed point modulo additions in the phase domain.

The configuration of digital signal processor 150 for providing logpolar processing and other processing of the digital signals, which includes one or more narrowband signals originally transmitted from transceivers 7a, 7b, is shown in FIG. 3. The logpolar digital signals from digitizer 125 are first processed by a frequency shifter 300. The frequency shifter 300 is used to provide for more effective and efficient extraction of narrowband signals lying in off-center subbands of the wide filter bandwidth of wide filter apparatus 115. Because the wide filter apparatus 115 of the receiver 2 is adapted for the wideband mode, narrowband signals received by radio 2 may not be centrally located in the wide filter bandwidth. Instead, the narrowband signals could be located in various off-center subbands within the wide filter bandwidth. The digital frequency shifter 300 functions to frequency shift the digital signal so that the desired narrowband signals located in one or more off-set subbands are shifted to the center of the wide filter bandwidth.

By passing the logpolar digital signals through the frequency shifter 300, narrowband signals lying at an offset frequency from the center of the wide filter bandwidth, but at least still within the wide filter bandwidth, can easily be shifted to lie at the center. The narrowband signals are shifted to the center by adding or subtracting suitable phase slopes to the inputted phase words. When the desired narrowband signals are centered, they will not exhibit a systematic phase rotation continuously in one direction or the other unless caused to do so by information modulation. The phase changes due to information modulation shall not of course be removed as they must be preserved for demodulation of the information. By processing the digital signals with frequency shifter 300, it is possible to select desired narrowband signals located within an off-set subband of the wide filter bandwidth to be shifted to a central position in the digital baseband.

In the preferred embodiment, the frequency shifter 300 is adapted to extract first narrowband signals transmitted by transmitter 7a and second narrowband signals transmitted by transmitter 7b. The first and second narrowband signals contain the same information but are transmitted at different radio channel frequencies and from different transmitters 7a, 7b to provide for diversity transmission. The first narrowband signals and second narrowband signals, after passing through wide filter apparatus 115, lie within the wide filter bandwidth and occupy off-center subbands. More specifically, the first and second narrowband signals may lie on opposite sides of the center frequency of the wide filter bandwidth. (In alternate embodiments, the first and second narrowband signals may both lie on the same side of the center frequency.) The frequency shifter 300 configured by digital signal processor 150 thus may correspondingly include a positive frequency shifter 302 for centering the first narrowband signals and a negative frequency shifter 304 for centering the second narrowband signals. The positive frequency shifter 302 frequency shifts samples of the digital signals upwards by an amount F1 calculated to position the first narrowband signals in the center of the wide filter bandwidth and produces first frequency-shifted samples. The negative frequency shifter 304 frequency shifts the same samples of the digital signal downwards in an amount F2 calculated to position the second narrowband signal in the center of the wide filter bandwidth and produces second frequency-shifted samples.

As schematically shown in FIG. 3, samples of the phase words are processed by both positive frequency shifter 302 and negative frequency shifter 304. The positive frequency shifter 302 adds positive phase slopes to positively shift the inputted phase words. The positive phase slopes added are calculated to shift the first narrowband signals to the center frequency of the wide filter bandwidth. Positively shifted phase words are generated by the positive frequency shifter 302 and together with samples of the amplitude words form first frequency-shifted signals in which the first narrowband signals are centered. In a similar manner, the negative frequency shifter 304 adds negative phase slopes to negatively shift the inputted phase words. The negative phase slopes added are calculated to shift the second narrowband signals to the same center frequency to which the first narrowband signals have been shifted. Negatively shifted phase words are generated by the negative frequency shifter 304 and together with samples of the amplitude words form second frequency-shifted signals in which the second narrowband signals are centered.

The digital signal processor 150 also includes amplitude scaler 306 for normalizing the amplitude associated with the frequency-shifted signals generated by frequency shifter 300. The amplitude scaler 306 normalizes the frequency-shifted signals to a convenient level by adding or subtracting scaling factors to/from the digital logamplitude signal. This factor should only change slowly to avoid disturbing the relative values of samples in a consecutive block and means to perform such post-digitization AGC by computing a moving average are disclosed in the parent application. Digitally normalizing a signal after it has been digitized is advantageous because more accurate, flexible and intelligent scaling systems can be devised using numerical processing than are practical in the analog domain where the signals have not been digitized.

After scaling and frequency shifting, polar-to-Cartesian converters 308a, 308b configured by digital signal processor 150 convert each scaled and frequency-shifted digital signal from logpolar form to Cartesian form. The polar-to-Cartesian converter 308 includes a pair of I,Q converters 308a, 308b for converting the frequency-shifted signals. The digital signals when converted into Cartesian form have a real part, conventionally denoted by the symbol I and an imaginary part denoted by Q. The digital signals are converted to Cartesian form because the desired narrowband signals can be more effectively filtered when in Cartesian form.

After the digital signals have been converted to Cartesian form, first frequency-shifted signals represented by $I_1$, $Q_1$ and second frequency-shifted signals represented by $I_2$, $Q_2$, are processed by digital narrowband filter 310. The same physical filter logic can be time-shared to successively filter all four signals $I_1$, $Q_1$, $I_2$, $Q_2$ alike. Digital narrowband filter 310 functions to extract the desired first and second narrowband signals which have been centered. The digital filter 310 has a low-pass cut-off frequency equal to the half-bandwidth of the desired centralized subband to which the desired narrowband signals have been shifted. Such filters can include FIR filters and IIR filters and are well known in the state of the art in digital filtering. The parent application discloses (parent application FIG. 3) the use of 64-tap FIR filters that are defined by 64 coefficients which can be chosen to realize many different desirable filter frequency responses.

The digital filter 310 computes digital signals $I_1'$, $Q_1'$ and $I_2'$, $Q_2'$ which can occur at a lower computation rate than the input sampling rate, commensurate with the bandwidth reduction. The output sampling rate should be at least twice the low-pass filter bandwidth, that is at least equal to the subband's whole bandwidth, in order to satisfy Nyquist's sampling theorem. The digital filter may thus perform reduction of sampling rate (downsampling) at the same time as filtering.

As shown in FIG. 3, two or more different narrowband signals falling within different subbands of the original wide bandwidth analog signal can be extracted simultaneously to provide for diversity demodulation. Different narrowband signals are simultaneously extracted from a wide bandwidth analog signal by converting the analog signal to a digital signal and then logpolar scaling, logpolar shifting, logpolar-to-Cartesian converting and I, Q filtering two or more subbands of the original wide bandwidth signal. The different narrowband signals are simultaneously or jointly extracted through use of duplicate frequency shifters 302, 304, amplitude scaler 306 and digital filters 310. The logpolar digital signal is subjected to an additive scaling and two (or more) modulo phase operations to produce two (or more) scaled and shifted signals lying centrally in the digital baseband. In the alternative, the different narrowband signals are simultaneously or jointly extracted by time sharing the discussed circuits used to extract the narrowband signals. For example, the $I_1'$, $Q_1'$, and $I_2'$, $Q_2'$ signals (four real sample streams in total) may be filtered using a single FIR filter 201 used in a time shared manner to produce two filtered subband signals.

The downsampled digital samples $I_1'$, $Q_1'$ and $I_2'$, $Q_2'$ representing the extracted narrowband signals are inputted to diversity narrowband demodulator 312 which is then adapted to the method of modulation and coding used at the transceivers 7a, 7b. Diversity narrowband demodulator 312 can provide demodulation of the signals through various digital demodulation and decoding algorithms. Diversity narrowband demodulator 312, for example, can operate according to any of the methods described in U.S. patent application Ser. No. 08/218,236 filed Mar. 28, 1994, and entitled "Diversity Pi/4-DQPSK Demodulation," which is hereby incorporated by reference. Other forms of processing may be used such as the combined demodulation and decoding method abbreviated to "decodulation" described in U.S. patent application Ser. No. 08/305,787, filed Sep. 14, 1994, and entitled "Simultaneous Demodulation and Decoding of a Digitally Modulated Radio Signal," which is incorporated by reference. In combination with the present invention, decodulation may be extended to perform diversity decodulation by use of metric combining. The technique of metric combining for diversity reception can also be used in the invention with or without decodulation, and is more fully described in the following references which are hereby incorporated by reference: U.S. Pat. No. 5,191,598, issued Mar. 2, 1993, and entitled "System For Reducing the Affects of Signal Fading on Received Signals"; *Receiver Performance of the North American Digital Cellular System*, Larson, Gudmundsson, and Raith, Proceedings VTC-91, St. Louis, Mo., May 19, 1991; and *MLSE Equalization and Decoding for Multipath-Fading Channels*, IEEE Trans. Commun., Vol. 39, No. 10, October 1991.

Receiver 2 can be adapted to operate for various different standards employing FDMA, TDMA, or a combination of FDMA and TDMA. For example, receiver circuits shown in FIG. 1 can be triggered by a TDMA timing generator to operate only in defined portions of a TDMA frame in order to collect samples over that timeslot in a memory. The samples in the memory can then be processed by the digital signal processor 150 configured as shown in FIG. 3 to generate subband samples corresponding to the same timeslot on two different frequencies, or indeed different timeslots on the same frequency, or different timeslots on different frequencies in order to produce two subband sample blocks. These subband sample blocks containing the desired narrowband signals are then diversity processed according to any of the aforementioned incorporated references.

The technique of receiving two narrowband signals simultaneously and diversity combining them in the above inventive way can be used with analog frequency-modulated signals of NAMPS type, and can be useful in effecting a make-before-break or soft handover for radios 3 crossing the boundary between two cells having associated base station narrowband transceivers 7a, 7b. The base station narrowband transceivers 7a, 7b are each caused to transmit the same modulation on neighboring frequency channels for a period and the radio 3 receives and combines both when located in the border or handover zone. When one signal becomes dominant and the other of insignificant signal strength, transmission of the insignificant signal is discontinued from the no longer useful transceiver 7a or 7b. Accordingly, the no longer useful transceiver 7a or 7b can allocate the radio channel frequency of the insignificant signal to another radio. Soft handovers for radios crossing the boundaries between different transceivers (i.e., cell boundaries) is well-known in the prior art and is disclosed in U.S. Pat. No. 5,109,528, issued Apr. 28, 1992, and entitled "Handover Method for Mobile Radio System," which is incorporated herein by reference.

The invention of an advantageous method of diversity reception of narrowband signals from two signal sources can thus be translated into an improved method for performing glitch-free soft handover in a mobile radio communication system, or can be used merely to enhance communications link margin, as for example is usually desired in power-limited satellite communications applications. The method of selecting one or more subbandwidths by a radio receiver 2 with the aid of logpolar processing is however more general than either of these specific applications.

Alternate embodiments of receiver 2 can also be provided. For example, digitizer 125 can be configured to convert the analog radio signal to a Cartesian or other digitized form which retains the full complex vector nature of the received radio signal. These other digitized forms can then be shifted and processed to extract one or more narrowband signals lying off-center of the wide filter bandwidth. Various methods are capable of digitizing a radio signal while preserving its full, complex-vector value. For example, the radio signal can be digitized through quadrature downconversion, quadrature sampling, and the homodyne receiver technique described in U.S. Pat. No. 5,241,702, issued Aug. 31, 1993, and entitled "DC Offset Compensation in a Radio Receiver."

The above-named techniques result in a Cartesian or X,Y-coordinate representation of the signal vectors having a real and imaginary part, conventionally known as I,Q values. When I,Q values are used, frequency shifters which have to rotate the signal vector phase by an increasing or decreasing angle to effect positive or negative frequency shifts, comprise complex multipliers. The preferred vector digitization technique is however the logpolar technique described in the above-incorporated U.S. Pat. No. 5,048,059. When logpolar vector representation is used, the frequency shifters 302, 304 are simplified to fixed point modulo arithmetic adders that combine an incrementing or decrementing phase value with the signal phase values.

The inventive radio 3 embodying both wide and narrowband modes may be switched between modes as described in U.S. patent application Ser. No. 08/305,780, filed Sep. 14, 1994, and entitled "Dual-Mode Frequency Synthesizer for Satellite/Cellular Phones," which is incorporated herein. Switching between modes is not a likely occurrence when the radio 3 is in active use during a call, but is more likely to occur when the radio 3 is in the idle or standby condition. Radios 3, particularly of the TDMA variety, can employ sleep-mode techniques to reduce battery drain in standby. Sleep modes comprise adoption of a particular formatting of the calling or paging channel to which radios 3 listen on standby for calls. The paging channel is divided into a number of timeslots known as sleep-mode slots and each radio 3 is allocated a particular sleep-mode slot to monitor. The slot allocation can for example be linked to the radio's number, e.g., the last digit of the number. Then the system will know that a call for a radio number ending in 9 should be sent in slot 9, when the radio 3 is awake and receiving the data. In this way, receivers 2 of the radio 3 only need to be awake for a fraction of the time during standby, saving battery power.

In a dual-mode radio 3 that may be served by a wideband system having a wideband transceiver 6 or a narrowband system having transceivers 7a, 7b, the time between sleep-mode slots on one system may be used to scan for signals of the other system. Thus the radio 3 may, while listening to the calling channel of one system, search for and determine the signal strength or quality of paging channels of another system. If the current paging channel being decoded is a wideband signal, the radio 3 can switch to a narrowband mode between sleep-mode slots of the wideband system in order to search for narrowband paging channels, e.g., those of a mobile satellite system. Alternatively, a radio 3 locked to a narrowband AMPS control channel, and incorporating intermittent reception may switch to the wideband mode to search for an IS-95 CDMA calling channel or pilot signal. If the radio 3 adapted for AMPS incorporates the power-saving, intermittent reception features described in U.S. patent application Ser. No. 08/059,932, filed May 11, 1993, and entitled "Standby Power Savings with Cumulative Parity Check in Mobile Phones," which is hereby incorporated by reference, then it may utilize the time saved from listening to the AMPS channel to scan for energy in channels of other systems such as IS-95 without loss of AMPS information, even though the AMPS control channel does not specifically adopt a sleep-mode slotted format. While the possibility to switch between wideband and narrowband modes during conversation is not excluded by the invention, this would represent an intersystem handoff which is a rather obscure occurrence, and its description would not be material to this invention.

A person skilled in the art will recognize that the operations performed to extract the narrowband signals can be performed by digital logic or by a programmable digital signal processor (DSP) or a combination. The wideband and the narrowband modes can be merely alternative firmware in the same hardware component. One primary advantage of the invention is thus that a single set of radio frequency receiver components may be used with alternative processing firmware to perform both modes at reduced cost. This facilitates the economic construction of subscriber units conforming to both narrowband and wideband standards such as AMPS/NAMPS as described in the parent application or dual-mode satellite/cellular radios as described in U.S. patent application Ser. No. 08/305,780, filed on Sep. 14, 1994, and entitled "Dual-Mode Satellite/Cellular Phone with a Frequency Synthesizer." The present invention may alternatively facilitate the construction of dual mode AMPS/IS-95 phones, triple-mode AMPS/IS-54/IS-95 phones, triple mode AMPS/NAMPS/IS-95 phones or quadruple-mode AMPS/NAMPS/IS-54/IS-95 radios.

It will be appreciated by those of ordinary skill in the art that the present invention can be embodied in other specific forms without departing from the spirit or essential character thereof. The presently disclosed embodiments are therefore considered in all respects to be illustrative and not restrictive.

What is claimed is:

1. A radio receiver for receiving radio signals containing first narrowband signals at a first radio channel frequency and second narrowband signals at a second radio channel frequency, comprising:
   a. a downconverter for downconverting the radio signals to generate downconverted signals;
   b. wideband filter means for filtering the downconverted signals with a wide filter bandwidth to generate filtered signals, wherein the filtered signals have a first subband containing the first narrowband signals and a second subband containing the second narrowband signals;
   c. a digitizer for digitizing the filtered signals to generate digital signals, wherein the digital signals represent the radio signals in polar form and include phase signals and amplitude signals,
   d. first frequency-shifting means for shifting the digital signals so as to shift the first narrowband signals by adding a first phase slope to the phase signals to a predetermined center frequency and generate first frequency-shifted signals;
   e. second frequency-shifting means for shifting the digital signals so as to shift the second narrowband signals by adding a second phase slope to the phase signals to the predetermined center frequency and generate second frequency-shifted signals,
   f. narrowband filter means for filtering the frequency-shifted signals with a filter bandwidth adapted to the narrowband signals so as to extract the first and second narrowband signals; and
   g. demodulator means for demodulating the extracted first and second narrowband signals and generating demodulated signals.

2. The radio receiver of claim 1, wherein the first and second narrowband signals have a common information content, and wherein the demodulator means jointly processes extracted first and second narrowband signals to extract a common information content and provide diversity combination.

3. The radio receiver of claim 1, wherein the downconverter includes a first local oscillator and a second local oscillator for downconverting the radio signals in stages, and wherein the wideband filter means includes at least one wideband filter disposed between the first and second oscillators and at least one wideband filter disposed after the second local oscillator.

4. The radio receiver of claim 1, wherein the first narrowband signal is located on one side of the predetermined center frequency and the second narrowband signal is located on an opposite side of the center frequency so that the digital signals are shifted in opposite directions by the first and second frequency-shifting means to position the first and second narrowband signals at the predetermined center frequency.

5. The radio receiver of claim 1, further including amplitude scaler means for normalizing the frequency-shifted signals.

6. The radio receiver of claim 5, wherein the amplitude scaler means normalizes the frequency-shifted signals by processing the amplitude signals.

7. The radio receiver of claim 1, further including a polar-to-Cartesian converter for converting the amplitude signals and phase signals of the frequency-shifted signals to real signals and imaginary signals representing the frequency-shifted signals, and wherein the narrowband filter means filters the frequency-shifted signals to extract the narrowband signals by processing the real and imaginary signals representing the frequency-shifted signals.

8. The radio receiver of claim 1, wherein the amplitude signals are related to the logarithm of the amplitudes of the instantaneous radio signals.

9. A radio receiver having a wideband mode for receiving radio signals containing wideband signals and a narrowband mode for receiving radio signals containing narrowband signals, comprising:
   a. a downconverter for downconverting the radio signals to generate downconverted signals;
   b. wideband filter means for filtering the downconverted signals with a wide filter bandwidth adapted to the wideband signals and generating filtered signals containing the wideband signals or narrowband signals;
   c. a wideband demodulator for receiving the filtered signals containing wideband signals and demodulating the wideband signals contained in the filtered signals;
   d. a digitizer for digitizing the filtered signals containing the narrowband signals and generating digital signals;
   e. first frequency-shifting means for shifting the digital signals so as to shift first narrowband signals at a first radio channel frequency to a desired center frequency and generate first frequency-shifted signals;
   f. narrowband filter means for filtering the first frequency-shifted signals with a filter bandwidth adapted to the first narrowband signals so as to extract the first narrowband signals; and
   g. a narrowband demodulator for demodulating the extracted first narrowband signals to generate first demodulated signals.

10. The radio receiver of claim 9, wherein the digital signals represent the radio signals in polar form and include phase signals and amplitude signals, wherein the first frequency-shifting means shifts the digital signals by adding a first phase sequence to the phase signals.

11. The radio receiver of claim 10, further including a polar-to-Cartesian converter for converting the amplitude signals and phase signals of the frequency-shifted signals to real signals and imaginary signals representing the frequency-shifted signals, and wherein the narrowband filter means filters the frequency-shifted signals to extract the narrowband signals by processing the real and imaginary signals representing the frequency-shifted signals.

12. The radio receiver of claim 9, wherein the predetermined center frequency is located in a central subband of the wide filter bandwidth so that the first narrowband signals of the first frequency-shifted signals are centered in the wide filter bandwidth.

13. The radio receiver of claim 9, wherein the downconverter includes a first local oscillator and a second local oscillator for downconverting the radio signals in stages, and wherein the wideband filter means includes at least one wideband filter disposed between the first and second oscillators and at least one wideband filter disposed after the second local oscillator.

14. The radio receiver of claim 9, further including amplitude scaler means for normalizing the frequency-shifted signals.

15. The radio receiver of claim 10, further including an amplitude scaler means for normalizing the first frequency-shifted signals by processing the amplitude signals.

16. The radio receiver of claim 10, wherein the amplitude signals are related to the logarithm of the amplitudes of the instantaneous radio signals.

17. The radio receiver of claim 9, further including second frequency-shifting means for shifting the digital signals so as to shift second narrowband signals at a second radio channel frequency the predetermined center frequency and generate second frequency-shifted signals, and wherein the narrowband filter means filters the second frequency-shifted signals with a filter bandwidth adapted to the second narrowband signals so as to extract the second narrowband signals, and wherein the narrowband demodulator demodulates the extracted second narrowband signals and generates second demodulated signals.

18. The radio receiver of claim 17, wherein the first and second narrowband signals have a common information content, and wherein the narrowband demodulator jointly processes extracted first and second narrowband signals to extract a common information content and provide diversity combination.

19. The radio receiver of claim 17, wherein the digital signals represent the radio signals in polar form and include phase signals and amplitude signals, wherein the first frequency-shifting means shifts the digital signals by adding a first phase sequence to the phase signals, and wherein the second frequency-shifting means shifts the digital signals by adding a second phase sequence to the phase signals.

20. The radio receiver of claim 17, wherein the first narrowband signal is located on one side of the predetermined center frequency and the second narrowband signal is located on an opposite side of the predetermined center frequency so that the digital signals are shifted in opposite directions by the first and second frequency-shifting means to position the first and second narrowband signals in the central subband.

21. The radio receiver of claim 19, further including a polar-to-Cartesian converter for converting the amplitude signals and phase signals of the frequency-shifted signals to real signals and imaginary signals representing the frequency-shifted signals, and wherein the narrowband filter means filters the frequency-shifted signals to extract the narrowband signals by processing the real and imaginary signals representing the frequency-shifted signals.

22. The radio receiver of claim 19, wherein the amplitude signals are related to the logarithm of the amplitudes of the instantaneous radio signals.

23. The radio receiver of claim 17, wherein the predetermined center frequency is located in a central subband of the wide bandwidth filter so that the first and second narrowband signals of the frequency-shifted signals are centered in the wide filter bandwidth.

24. A method for receiving radio signals with a radio receiver where the radio signals contain first narrowband signals at a first radio channel frequency and second narrowband signals at a second radio channel frequency, comprising:
 a. downconverting the radio signals to generate downconverted signals;
 b. filtering the downconverted signals with a wide filter bandwidth to generate filtered signals, wherein the filtered signals have a first subband containing the first narrowband signals and a second subband containing the second narrowband signals;
 c. digitizing the filtered signals to generate digital signals, wherein the digital signals represent the radio signals in polar form and include phase signals and amplitude signals;
 d. frequency shifting the digital signals so as to shift the first narrowband signals by adding a first phase slope to the phase signals to a predetermined center frequency and generate first frequency-shifted signals;
 e. frequency shifting the digital signals so as to shift the second narrowband signals by adding a second phase slope to the phase signals to the predetermined center frequency and generate second frequency-shifted signals,
 f. filtering the frequency-shifted signals with a filter bandwidth adapted to the narrowband signals so as to extract the first and second narrowband signals; and
 g. demodulating the extracted first and second narrowband signals to generate demodulated signals.

25. The method of claim 24, wherein the first and second narrowband signals have a common information content, and wherein the step of demodulating includes the step of jointly processing the extracted first and second narrowband signals to extract a common information content and provide diversity combination.

26. The method of claim 24, wherein the first subband of the wide bandwidth filter is located on one side of the predetermined center frequency and the second subband of the wide bandwidth filter is located on an opposite side of the predetermined center frequency, and wherein the step of shifting the digital signals includes shifting the digital signals in opposite directions to position the first and second narrowband signals at the predetermined center frequency.

27. The method of claim 24, further including the step of normalizing the frequency-shifted signals by processing the amplitude signals.

28. The method of claim 24, further including the steps of converting the amplitude signals and phase signals of the frequency-shifted signals to real signals and imaginary signals representing the frequency-shifted signals, and filtering the frequency-shifted signals to extract the narrowband signals by processing the real and imaginary signals representing the frequency-shifted signals.

29. The radio receiver of claim 24, wherein the amplitude signals are related to the logarithm of the amplitudes of the instantaneous radio signals.

30. A method for receiving radio signals with a radio receiver where the radio signals contain alternatively wideband signals or narrowband signals, comprising:
 a. downconverting the radio signals to generate downconverted signals;
 b. filtering the downconverted signals with a wide filter bandwidth adapted to the wideband signals to generate filtered signals alternatively containing the wideband signals or narrowband signals;
 c. demodulating the filtered signals containing wideband signals and demodulating the wideband signals contained in the filtered signals;
 d. digitizing the filtered signals containing the narrowband signals to generate digital signals;
 e. frequency shifting the digital signals so as to shift first narrowband signals at a first radio channel frequency to a predetermined center frequency and generate first frequency-shifted signals;
 f. filtering the first frequency-shifted signals with a filter bandwidth adapted to the first narrowband signals so as to extract the first narrowband signals; and
 g. demodulating the extracted first narrowband signals to generate first demodulated signals.

31. A radio communication system for communicating with radios alternatively by wideband signals and narrowband signals, comprising:

a. a first narrowband transceiver for transmitting first narrowband signals;

b. a second narrowband transceiver for transmitting second narrowband signals;

c. a wideband transceiver for transmitting wideband signals; and d. a radio including a radio receiver having a wideband mode for receiving radio signals containing wideband signals and a narrowband mode for receiving radio signals containing narrowband signals, the radio receiver including:

i) a downconverter for downconverting the radio signals to generate downconverted signals;

ii) wideband filter means for filtering the downconverted signals with a wide filter bandwidth adapted to the wideband signals and generating filtered signals containing the wideband signals or narrowband signals, wherein the filtered signals containing the narrowband signals have a first subband containing the first narrowband signals and a second subband containing the second narrowband signals;

iii) a wideband demodulator means for receiving the filtered signals containing wideband signals and demodulating the wideband signals contained in the filtered signals;

iv) a digitizer for digitizing the filtered signals containing the narrowband signals and generating digital signals;

v) first frequency-shifting means for shifting the digital signals so as to shift the first narrowband signals to a predetermined center frequency and generate first frequency-shifted signals;

vi) second frequency-shifting means for shifting the digital signals so as to shift the second narrowband signals to the predetermined center frequency and generate second frequency-shifted signals, vii) narrowband filter means for filtering the frequency-shifted signals with a filter bandwidth adapted to the narrowband signals so as to extract the first and second narrowband signals; and viii) a narrowband demodulator means for demodulating the extracted first and second narrowband signals and generating demodulated signals.

32. The radio receiver of claim 31, wherein the digital signals represent the radio signals in polar form and include phase signals and amplitude signals, wherein the first frequency-shifting means shifts the digital signals by adding a first phase slope to the phase signals.

33. The radio receiver of claim 32, further including a polar-to-Cartesian converter for converting the amplitude signals and phase signals of the frequency-shifted signals to real signals and imaginary signals representing the frequency-shifted signals, and wherein the narrowband filter means filters the frequency-shifted signals to extract the narrowband signals by processing the real and imaginary signals representing the frequency-shifted signals.

34. The radio receiver of claim 32, further includes an amplitude scaler means for normalizing the first frequency-shifted signals by processing the amplitude signals.

35. The radio receiver of claim 31, wherein the first and second narrowband signals have a common information content, and wherein the narrowband demodulator jointly processes extracted first and second narrowband signals to extract a common information content and provide diversity combination.

36. The radio communication system of claim 31, wherein the first and second narrowband transceivers are located in different satellites.

37. The radio communication system of claim 35, further including means for making a soft handover for a radio moving through a border zone between two cells, wherein the first and second narrowband transceivers transmit narrowband signals having the same information content to the radio receiver when the radio is in the handover zone and wherein one of the narrowband transceivers discontinues transmitting narrowband signals to the radio which has moved out of the border zone and reallocates the radio channel frequency of the narrowband signals no longer being transmitted for use by another radio.

* * * * *